United States Patent [19]
Verret

[11] Patent Number: 5,198,372
[45] Date of Patent: Mar. 30, 1993

[54] METHOD FOR MAKING A SHALLOW JUNCTION BIPOLAR TRANSISTOR AND TRANSISTOR FORMED THEREBY

[75] Inventor: Douglas P. Verret, Sugarland, Tex.

[73] Assignee: Texas Instruments Incorporated, Dallas, Tex.

[21] Appl. No.: 679,896

[22] Filed: Apr. 3, 1991

Related U.S. Application Data

[63] Continuation of Ser. No. 213,804, Jun. 30, 1988, abandoned, which is a continuation-in-part of Ser. No. 932,752, Nov. 19, 1986, abandoned, which is a continuation-in-part of Ser. No. 824,388, Jan. 30, 1986, abandoned.

[51] Int. Cl.[5] ............................................. H01L 21/265
[52] U.S. Cl. ........................................ 437/31; 437/192; 437/193; 437/200
[58] Field of Search ................. 437/31, 200, 192, 193; 357/67

[56] References Cited

U.S. PATENT DOCUMENTS

| | | | |
|---|---|---|---|
| 3,604,986 | 9/1971 | Lepselter | 437/201 |
| 3,775,192 | 11/1973 | Beale | 437/31 |
| 4,495,512 | 1/1985 | Isaac et al. | 357/67 |
| 4,683,645 | 8/1987 | Naguib et al. | 357/67 |
| 4,774,204 | 9/1988 | Havemann | 437/200 |
| 4,788,160 | 11/1988 | Havemann et al. | 437/200 |
| 4,816,423 | 3/1989 | Havemann | 437/31 |
| 4,902,640 | 2/1990 | Sachitano et al. | 437/193 |

Primary Examiner—Brian E. Hearn
Assistant Examiner—Tuan Nguyen
Attorney, Agent, or Firm—Richard A. Stoltz; James C. Kesterson; Richard L. Donaldson

[57] ABSTRACT

Disclosed is a process for forming a bipolar transistor at the face (22) of a semiconductor layer. A refractory metal layer (34) is deposited on the face (22) to cover a base area (38) thereof. A dopant (40) is implanted through the metal layer (34) within the base area (38) to penetrate the face (22). The metal layer (34) is then removed from the face within an emitter area (48) contained within the base area (38). A dopant is then diffused into the face within the emitter area (48). Finally, the dopants are annealed to form a shallow base region (66) that spaces an emitter region (64) from a collector region (12, 14). The process of the invention can form a high-concentration emitter/base junction only 400 Angstroms from the surface of the semiconductor layer.

14 Claims, 2 Drawing Sheets

METHOD FOR MAKING A SHALLOW JUNCTION BIPOLAR TRANSISTOR AND TRANSISTOR FORMED THEREBY

RELATED APPLICATIONS

This is a continuation of application Ser. No. 07/213,804, filed Jun. 30, 1988 now abandoned, which is a continuation-in-part of application Ser. No. 932,752 filed Nov. 19, 1986 abandoned, which in turn is a continuation-in-part of application Ser. No. 824,388 filed Jan. 30, 1986, now abandoned.

TECHNICAL FIELD OF THE INVENTION

The present invention relates in general to the fabrication of thin P/N junctions in integrated circuit devices, and more particularly to a process for forming a shallow junction bipolar transistor and the integrated circuit transistor formed thereby.

BACKGROUND OF THE INVENTION

In the fabrication of conventional very high performance ($f_T = 15$ GHz) bipolar transistors, severe limitations have been put on emitter/base and base/collector junction depths in attempting to produce shallow devices. To fabricate a high-performance transistor, the dopant concentrations in the emitter and base need to be fairly high. On the other hand, high dopant concentrations of the emitter and base tend to diffuse inwardly into the semiconductor layer, increasing the total thickness of the transistor.

Several conventional attempts have been made to fabricate a high-speed bipolar device in very large scale integrated (VLSI) technology. One technique developed in pursuit of this objective is a polysilicon self-aligned device as described by K. Okada in *IEEE Journal of Solid State Circuits*, Vol. SC-13, No. 5 (October, 1978). In this attempted solution, a self-aligned bipolar device used a local oxide separation method to separate the base region and the (N+) emitter. Due to the size constraints of the oxide, this device does not lend itself to significant size reduction.

In U.S. Pat. No. 4,148,468 issued to M. Vora, a polysilicon-aligned device was disclosed that deposited the (N+) polysilicon initially and then grew a thin spacer oxide, after which a (p+) material was deposited. According to the fabrication of this device, the oxidation was performed at 1000° C., thereby making it difficult to keep the base profile shallow.

These and other conventional approaches have all had their drawbacks in attempting to fabricate a very high performance bipolar device in a VLSI circuit. Accordingly, a need has arisen for a process for fabricating a very high performance bipolar device with shallow emitter/base and base/collector junctions.

SUMMARY OF THE INVENTION

One aspect of the invention comprises a method for forming a shallow P/N junction near the face of a semiconductor layer of a first conductivity type. According to this method, a metal layer is deposited, the metal selected from the group consisting of refractory metals, noble metals and alloys thereof. The metal layer is deposited on the face of the semiconductor layer. A dopant of a second conductivity type is then implanted through the metal layer into the face. The interposition of the metal layer causes the formation of a P/N junction between regions of different conductivity types that is extremely shallow, generally on the order of 400 to 1000 Angstroms.

According to another aspect of the invention, a process for forming a bipolar transistor at the face of the semiconductor layer of a first conductivity type includes depositing a refractory metal layer on the face to cover a base area. A dopant of the second conductivity type is implanted through the metal layer within the base area to penetrate the face. The middle layer is then removed from the face within an emitter area that is disposed inside the base area. A dopant of the first conductivity type is diffused into the face within the emitter area, and the dopants are annealed to form a shallow base region of the second conductivity type as spacing an emitter region of the first conductivity type from a collector region of the first conductivity type. This process is able to form a bipolar transistor having a base/emitter junction $X_{je}$ of 1000 Angstroms or less, preferably about 400 Angstroms; and a base/collector junction $X_{jb}$ that is approximately 1500 Angstroms from the face of the semiconductor layer. These junction depths are obtained with a base region dopant concentration of at least $3 \times 10^{17}$ ions/cm$^3$, thereby militating against P/N junction punch-through. A further advantage of the invention is conferred by the metal layer that remains over the base area, thereby forming an extrinsic base having a reduced base contact resistance. The metal layer also provides a positive etch stop for a conductive poly base contact layer preferably disposed immediately above it.

BRIEF DESCRIPTION OF THE DRAWINGS

Further aspects of the invention and their advantages may be discerned from the following detailed description in conjunction with the appended drawings in which.

DETAILED DESCRIPTION OF THE INVENTION

Figure 1:
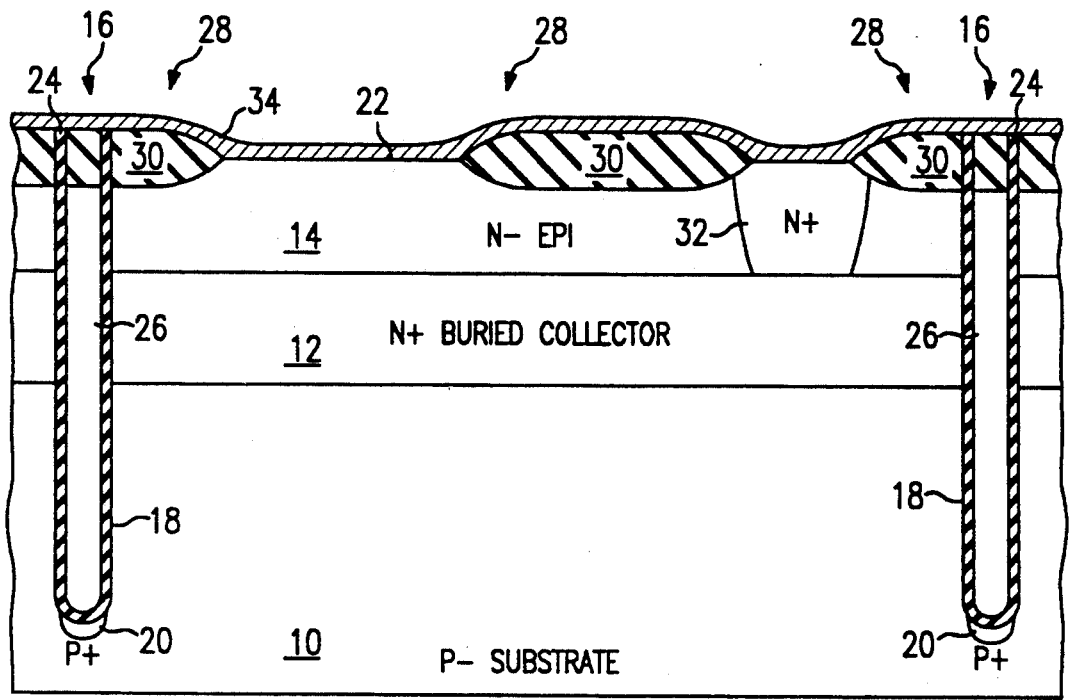
FIGS. 1–4 are highly magnified sectional views of a semiconductor substrate, showing successive stages in the fabrication of a trench-isolated bipolar transistor using the shallow junction fabrication process of the invention.

Referring to FIG. 1, the beginning stages of the fabrication of an NPN shallow emitter-base junction transistor are shown. The beginning stages prior to the critical process stages of the invention will be briefly described. A (P) type silicon substrate 10 is first subjected to a blanket implant of a donor species. Substrate 10 can be doped with an (N) type dopant such as antimony to obtain a buried collector region 12 with a final sheet resistance of 10–20 ohms/square. Next an (N) type epitaxial layer 14 is formed over the antimony-implanted buried collector region 12 at reduced pressure to a thickness of 0.8 to 1.4 microns with a resistivity 0.3 to 1.0 ohm-cm. This thickness of epitaxial layer 14 is about 20% less than the thicknesses of epitaxial layers used in conventional technologies and requires shallow emitter and base regions.

A layer of silicon dioxide (not shown) is then deposited to a thickness of about 1.0 to 1.5 microns. A layer of photoresist (not shown) is then deposited over the silicon dioxide, exposed to ultra violet light through a mask, and the exposed portions removed in order to expose trench regions indicated generally at 16. Depending on the number of transistors, there may be several such trench regions. The silicon dioxide over each trench region 16 is then etched to expose the silicon therebeneath, and the silicon is then etched using the oxide layer (not shown) as a mask to form a deep trench 18 extending below the buried collector region 12 and having a width of 1.5 to 2.0 microns.

A sidewall oxide layer (not shown) is next grown over the walls of the trenches 18 by placing the cell in an atmosphere of steam at a temperature of approximately 1,000° C. for about 15 minutes. A channel stop boron implant is then directed into the trench 18 at an energy of 40 to 60 keV and a concentration of about $1 \times 10^{14}$ atoms/cm$^2$ to form a (P+) channel stop region 20 below each trench 18 in order to prevent an inversion layer from forming around the later-formed trench oxide sidewall. An etch removes the layer of silicon dioxide (not shown) on a surface 22 of the (N−) epitaxial layer 14 and on the trench sidewall. A new layer 24 of sidewall oxide is then grown.

Next, the trenches 18 are filled with a polysilicon deposit 26, and onto this last layer, a layer of photoresist (not shown) is deposited which is flat. An etch is selected to have an etch rate which will etch the photoresist at substantially the same rate as the underlying polysilicon. Thus, upon etching the photoresist and polysilicon down to the silicon surface 22, a flat surface is achieved.

The old oxide layer (not shown) is removed and a new oxide layer (also not shown) is grown to a thickness of 800 to 1,200 Angstroms. A layer of silicon nitride (not shown) is formed over the oxide surface by a low pressure chemical vapor deposition. A layer of photoresist (not shown) is deposited over the nitride and then patterned to expose isolation regions indicated generally at 28. The exposed isolation regions 28 are then etched to remove the nitride and oxide layers (not shown). The entire wafer is then exposed to an oxidizing high pressure atmosphere at about 1000° C. for about 2 hours. During oxidation, silicon is consumed so that a plurality of relatively thick oxidation isolation regions 30 are formed. During this step the polysilicon 26 at the top of the trenches 18 is converted to oxide 30.

Next, an (n.) collector contact region 32 is defined by a layer of patterned photoresist (not shown) and implanted with phosphorus. Collector contact region 32 is made deep enough to connect with buried collector 12 by implanting the phosphorus at an energy of 100–200 keV with the dose in the range of $4 \times 10^{15}$ to $3 \times 10^{16}$ atoms/cm$^2$.

After this step, a thin, uniform layer 34 of metal is deposited, with preferred metals being refractory metals forming silicides above 700° C., or metals which do not form silicides such as gold or silver. Titanium is a particularly preferred metal, and the thickness of layer 34 as made of Ti should be on the order of 500 to 1000 Angstroms. Where molybdenum or tungsten are used, the metal layer 34 can be thinner. Silver and gold tend to migrate and form generation-recombination centers. These species are therefore less preferably used unless their current carrier "lifetime-killing" effects are desired, such as in the fabrication of "faster" semiconductor devices.

Figure 2:
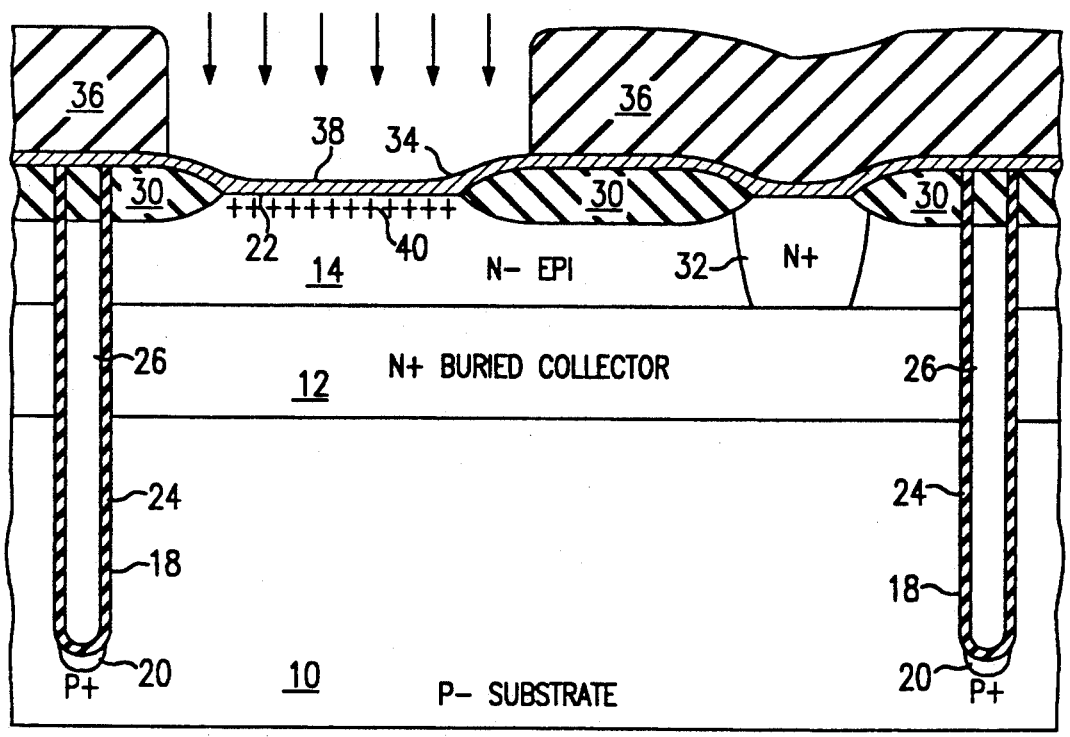

Turning now to FIG. 2, a layer 36 of photoresist is deposited and developed to expose an area 38 of the metal surface. An implantation step is next performed with a (P) type dopant, boron being a particularly preferred species. Where metal layer 34 constitutes titanium, and is approximately 500–1000 Angstroms thick, the implantation energy should be 10–30 KeV to penetrate metal layer 34. The implanted impurity is represented by "pluses" 40. The expected penetration of the implant into epitaxial layer 14 is on the order of 0.12 to 0.18 microns. Resist layer 36 is then removed.

Figure 3:
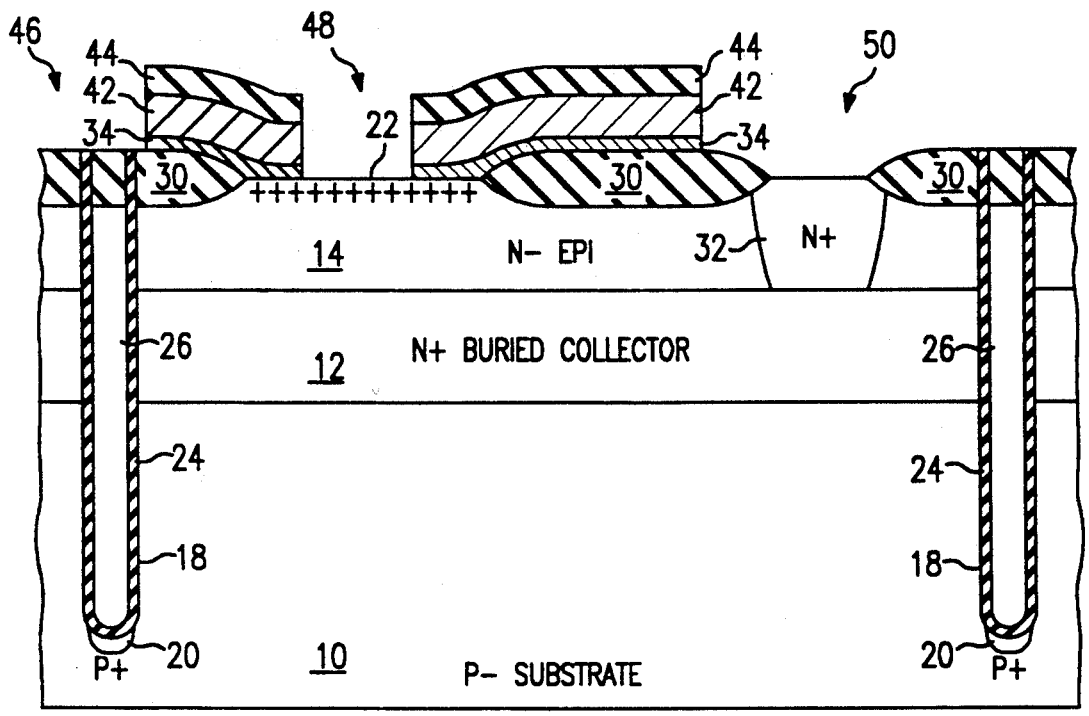

Referring next to FIG. 3, a layer 42 of polycrystalline silicon is deposited in a non-oxidizing ambient atmosphere such as nitrogen, and preferably below 700° C. Alternatively, amorphous silicon can be deposited using low pressure chemical vapor deposition to form layer 42. The thickness of layer 42 is approximately 3000–5000 Angstroms, and is deposited over the entire wafer. If the metal selected to form metal layer 34 forms a silicide below 700° C., an etch must be available to etch this metal silicide completely from the underlying epitaxial layer 14.

Layer 42 is next implanted with a (P) type dopant, preferably boron, to render it conductive. The implantation energy and the thickness of layer 42 are chosen to avoid putting any of the (P) dopant into epitaxial layer 14. Layer 42 should be doped to a sheet resistance of 500–2000 ohms/square.

After this, a dielectric layer 44 is deposited over polycrystalline silicon layer 42 to a thickness in the range of 3,000–5,000 Angstroms. The dielectric layer 44 is preferably silicon dioxide as deposited by low pressure chemical vapor deposition (LPCVD). A layer of photoresist (not shown) is then deposited on the wafer and patterned. The photoresist layer leaves exposed an area indicated generally at 46, an emitter area indicated generally at 48 and an area indicated generally at 50 for a subsequent in situ series of etches. The patterned areas of oxide layer 44, polysilicon layer 42 and the metal layer 34 are sequentially removed. Metal layer 34 acts as an etch stop to the polycrystalline or amorphous silicon etch used to etch away layer 42. In turn, the epitaxial layer 14 acts as an etch stop to the etchant used to etch away metal layer 34. The interposition of metal layer 34 between poly layer 42 and epitaxial layer 14 confers a technical advantage in that it provides a natural etch stop. This prevents damage to epitaxial layer 14, and permits the formation of shallow P/N junctions as will be described below. Otherwise, good etch selectivity could not be obtained for the poly layer 42 with respect to epitaxial layer 14.

The last-described series of etches defines the lateral margins of an extrinsic base formed by layers 34, 42 and 44. The presence of metal layer 34 reduces the resistance value $r_b'$, a key parasitic resistance. The lower $r_b'$ is, the higher the value of $f_{max}$, thus enhancing the performance of the transistor.

In other areas of the wafer, metal/poly/oxide stack 34, 42, 44 could be used to form high- and low-sheet-resistance resistors. Where a high-sheet resistor is desired, layer 34 would be removed in a high sheet resistor area prior to depositing poly layer 42. A low-sheet resistor could be fabricated by having metal layer 34 intact in a low sheet resistor area of the wafer. These resistors could be made with the same (p+) dose used to render layer 42 conductive, thus minimizing the cost of their fabrication. A substrate resistor could also be made with the method of the invention by implanting a (p+) dose through a metal layer that would be subsequently removed. Such a substrate resistor would likely have a low TCR.

The metal etch may optionally be followed by a dilute RCA cleaning sequence in order to remove any remaining traces of residual metal. An interfacial oxide process (not shown) may also be added.

Figure 4:
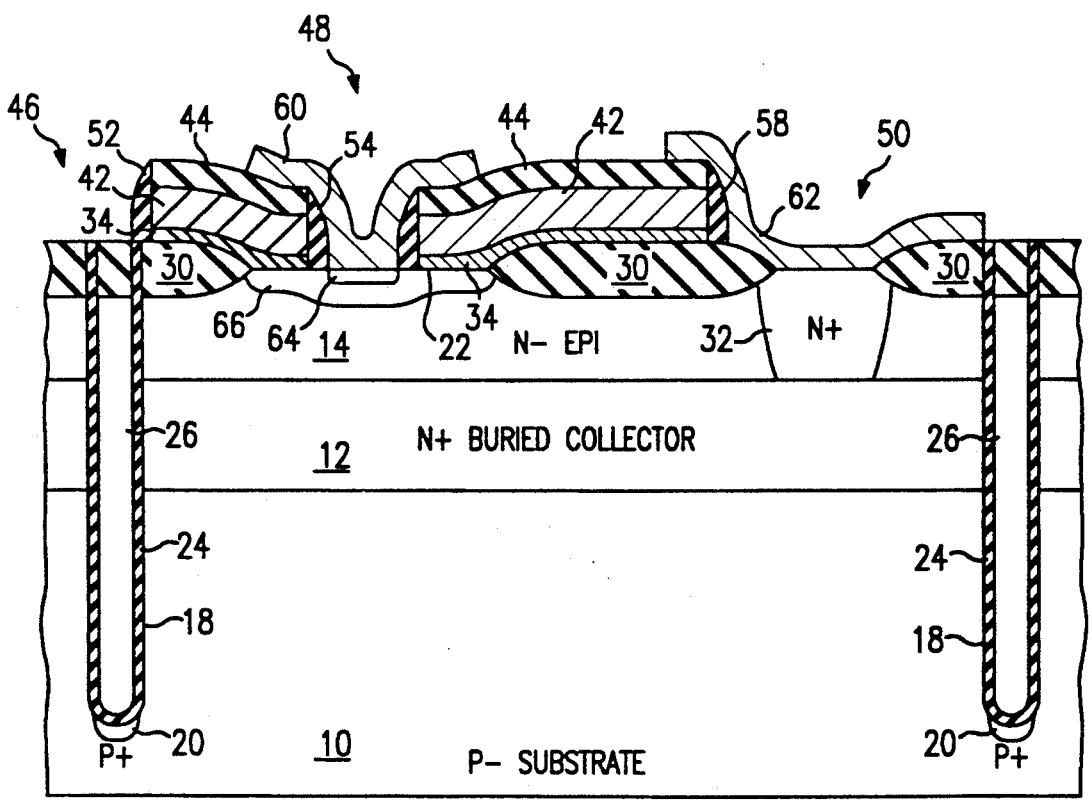

Referring now to FIG. 4, the next process step involves the formation of sidewall spacers by first laying down a conformal deposition of LPCVD oxide (not shown) which is then etched back with an anisotropic dry etch to leave oxide sidewall spacers 52, 54, 56 and 58 on the sidewalls of the oxide/polycrystalline silicon stacks 42 and 44. Alternatively, silicon nitride or polysilicon (undoped) can be used in place of oxide spacers 52-58.

Next, a polysilicon layer (not shown) is deposited and implanted with an (N) type dopant such as phosphorus at an energy in the range of 80 to 100 keV and at a concentration in the range of $5 \times 10^{15}$ to $2 \times 10^{16}$ atoms/cm$^2$. Then the polysilicon layer is patterned and etched to form an (N+) poly emitter contact pad 60 and an (N+) poly collector contact pad 62.

The next step is a rapid optical (or flash) anneal that activates the dopant and causes a slight diffusion of (N) type dopant to form a bipolar emitter region 64. The activation of the (P) type dopant forms a base region 66. The flash anneal confers a principal advantage of the invention in that it causes the formation of an extremely shallow emitter/base junction. It has been found that the emitter depth $x_{je}$ is in the range of approximately 0.04 to 0.10 microns, and that the base depth $x_{jb}$ is approximately 0.15 microns. Therefore, the transistor junction thickness $x_{jb}$-$x_{je}$ is approximately 0.05 to 0.11 microns.

In a particular example, a 1000-Angstrom thick titanium layer 34 was deposited over the base region, and boron was implanted at a dose of $1 \times 10^{16}$ ions/cm$^2$ at an implantation energy of 20 KeV. The peak concentration thus produced in the base region was ions/cm$^3$, and the junction depth was determined to be about 400 Angstroms. The peak concentration occurred at approximately 200 Angstroms into epitaxial layer 14. In another test, 1000 Angstroms of titanium were deposited as metal layer 34, and boron was implanted through this metal layer at a dose of $1 \times 10^{16}$ ions/cm$^2$, and at an implantation energy of 30 KeV. The peak concentration was determined to be $3 \times 10^{17}$ ions/cm$^3$. This concentration occurred at the surface of epitaxial layer 14. The junction depth occurred at about 1000 Angstroms. The above transistors are expected to have $f_T$'s on the order of 15-20 GHz.

The illustrated shallow-junction NPN bipolar transistor may be completed by the following steps (not shown). A layer of phosphosilicate glass can be deposited for stabilization and all contacts, including base, collector, emitter and resistor and Schottky diode contacts are patterned and etched. Alternatively, a thick oxide layer may be deposited after the formation of the polysilicon contact pads 60 and 62 followed by etching to produce a substantially planar top surface and then patterning and etching the contacts. Conventional metallization processing is then used to provide interconnects.

In an alternative embodiment (not shown), metal layer 34 can be removed after the implant of the base region 66 and before the deposit of poly layer 42. This may be advantageous if the proximity of metal layer 34 to the P-N junction formed by base region 66 and emitter 64 deteriorates the blocking characteristics of the junction. This embodiment could be useful for saturating logic applications, such as TTL, or where the emitter-base junction is used as a Zener diode. Another solution to this problem would be to increase the width of sidewall spacers 54 and 56.

While the invention has been described in conjunction with a trench-isolated NPN bipolar transistor, it has application to any bipolar transistor incorporating at least one extremely shallow, high-concentration P/N junction.

In summary, a method for forming a shallow P/N junction using a metal implant barrier layer has been shown and described. The method can produce a bipolar transistor having an extremely high performance $f_T$ of approximately 15-20 Gigahertz and an emitter-base junction depth on the order of 400 Angstroms.

While preferred embodiments of the invention and their advantages have been described in the above detailed description, the invention is not limited thereto but only by the spirit and scope of the appended claims.

What is claimed is:

1. In a process for forming a bipolar transistor at a face of a semiconductor layer of a first conductivity type, the method comprising the steps of:
   depositing a refractory metal layer on the face to cover at least a base area thereof;
   implanting a dopant of a second conductivity type through the metal layer within the base area to penetrate the face;
   removing the metal layer only from an emitter area of the face within the base area;
   introducing dopant of the first conductivity type into the emitter area; and
   annealing the dopants to form a shallow base region of the second conductivity type and an emitter region of the first conductivity type in the semiconductor layer that correspond to the respective base and emitter areas, the base region spacing the emitter region from a collector region in the semiconductor layer of the first conductivity type.

2. The process of claim 1, wherein said step of depositing the refractory metal layer comprises depositing metal selected from the group consisting of refractory metals that do not form a silicide below at least 700° C.

3. The process of claim 2, wherein said step of depositing the refractory metal layer comprises depositing metal selected from the group consisting of titanium, tungsten, molybdenum and alloys thereof.

4. The process of claim 1, wherein:
   the metal layer is deposited to a depth of 500-1000 Angstroms; and the dopant is implanted through the metal layer at a dose of about $10^{16}$ ions/cm$^2$.

5. The process of claim 4, wherein:
   said refractory metal is a titanium layer on the face to a depth of approximately 1000 Angstroms; and
   boron is implanted through the titanium layer at an implantation energy within the range of about 20 KeV to about 30 KeV.

6. The process of claim 1, wherein said steps of diffusing and annealing comprise the further steps of:
   forming a layer of material doped by the dopant of the first conductivity type such that the material contacts the face within the emitter area; and
   flash-annealing the base area and the emitter area to form the shallow base region and the emitter region.

7. The process of claim 6, and further comprising the step of depositing a polycrystalline layer comprising silicon to contact the face within the emitter area before said step of annealing.

8. The process of claim 6, and further comprising the steps of:
   after said step of implanting the dopant, depositing a conductive layer comprising polycrystalline material on the metal layer across the base area;
   before said step of removing the metal layer, removing the conductive layer from the emitter area to create an emitter orifice in the conductive layer;
   after said step of removing the metal layer, conformally depositing a dielectric layer over the conductive layer and in the emitter orifice;
   anisotropically back-etching the dielectric layer until only dielectric sidewalls within the emitter orifice remain, said sidewalls extending from the face of the semiconductor layer outwardly to insulate the interior of the orifice from the conductive layer;
   depositing a doped layer comprising silicon in the emitter orifice; and
   annealing the doped layer to diffuse dopant into the emitter region.

9. The process of claim 8, wherein:
   said conductive layer is deposited over a resistor area of the semiconductor layer to form a resistor.

10. The process of claim 9, wherein the refractory metal layer is deposited on a resistor area of the semiconductor layer spaced from the base area; and
   the conductive layer is deposited on the metal layer over the resistor area to form a low-sheet-resistance resistor.

11. The process of claim 9, wherein the metal layer is removed from over the resistor area such that a high-sheet-resistance resistor will be formed from the conductive layer.

12. The process of claim 6, and further comprising the steps of:
   after said step of removing the metal layer, depositing an amorphous layer comprising silicon on the emitter area;
   doping the amorphous layer; and
   annealing the doped amorphous layer to diffuse dopant into the emitter region.

13. The process of claim 1, wherein said step of annealing the dopants is performed such that an emitter/base junction of the transistor is about 500 Angstroms from the face, and such that a base/collector junction of the transistor is approximately 1000 Angstroms from the face.

14. The process of claim 1, wherein the metal layer that remains over the base area forms an extrinsic base.

* * * * *